(12) United States Patent
Wong et al.

(10) Patent No.: US 8,173,532 B2
(45) Date of Patent: May 8, 2012

(54) SEMICONDUCTOR TRANSISTORS HAVING REDUCED DISTANCES BETWEEN GATE ELECTRODE REGIONS

(75) Inventors: Robert C. Wong, Poughkeepsie, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 540 days.

(21) Appl. No.: 11/830,090

(22) Filed: Jul. 30, 2007

(65) Prior Publication Data

US 2009/0032886 A1 Feb. 5, 2009

(51) Int. Cl.
*H01L 21/3205* (2006.01)
*H01L 21/4763* (2006.01)
*H01L 21/461* (2006.01)
*H01L 21/8244* (2006.01)
*H01L 21/302* (2006.01)
*H01L 27/118* (2006.01)
*H01L 27/088* (2006.01)
*H01L 27/11* (2006.01)

(52) U.S. Cl. ........ 438/587; 257/202; 257/393; 257/903; 257/E27.099; 257/E21.661; 438/724; 438/757

(58) Field of Classification Search .................. None
See application file for complete search history.

(56) References Cited

U.S. PATENT DOCUMENTS

| | | | |
|---|---|---|---|
| 5,032,535 A * | 7/1991 | Kamijo et al. | 438/304 |
| 6,281,084 B1 | 8/2001 | Akatsu et al. | |
| 7,067,366 B2 | 6/2006 | Gehres | |
| 7,118,955 B2 | 10/2006 | Amon et al. | |
| 7,157,341 B2 | 1/2007 | Martin et al. | |
| 2004/0075122 A1 * | 4/2004 | Lin et al. | 257/288 |
| 2004/0248395 A1 * | 12/2004 | Yoneda et al. | 438/622 |
| 2005/0020043 A1 * | 1/2005 | Lai | 438/587 |
| 2006/0166424 A1 | 7/2006 | Schaeffer, III et al. | |
| 2006/0237769 A1 * | 10/2006 | Van Schaijk et al. | 257/315 |
| 2007/0025142 A1 * | 2/2007 | Joo | 365/154 |
| 2007/0047301 A1 | 3/2007 | Aritome | |
| 2007/0221960 A1 * | 9/2007 | Ashida | 257/213 |

FOREIGN PATENT DOCUMENTS

WO WO2004066389 A2 * 8/2004

* cited by examiner

*Primary Examiner* — Hoang-Quan Ho
(74) *Attorney, Agent, or Firm* — Schmeiser, Olsen & Watts; Ian D. MacKinnon

(57) ABSTRACT

A semiconductor structure and a method for forming the same. The method includes providing a semiconductor structure which includes a semiconductor substrate. The semiconductor substrate includes (i) a top substrate surface which defines a reference direction perpendicular to the top substrate surface and (ii) first and second semiconductor body regions. The method further includes forming (i) a gate divider region and (ii) a gate electrode layer on top of the semiconductor substrate. The gate divider region is in direct physical contact with gate electrode layer. A top surface of the gate electrode layer and a top surface of the gate divider region are essentially coplanar. The method further includes patterning the gate electrode layer resulting in a first gate electrode region and a second gate electrode region. The gate divider region does not overlap the first and second gate electrode regions in the reference direction.

12 Claims, 10 Drawing Sheets

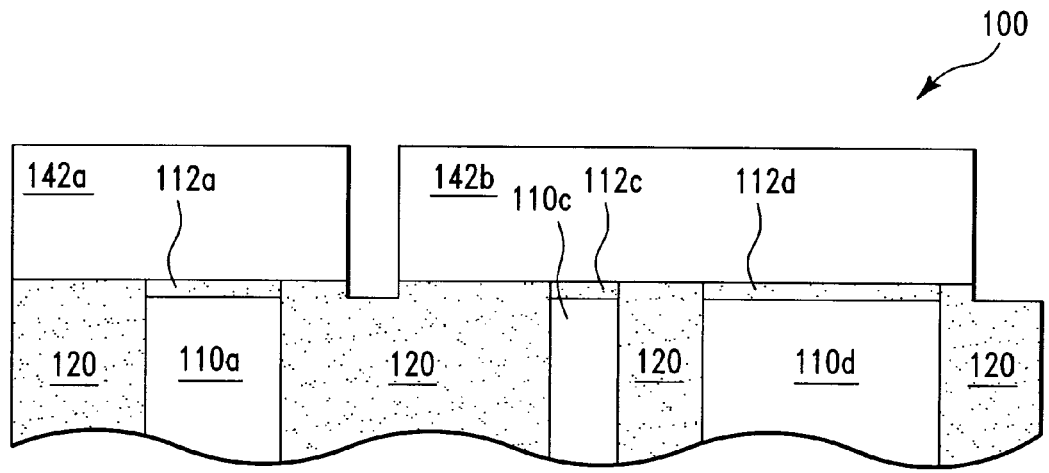
FIG. 1H'
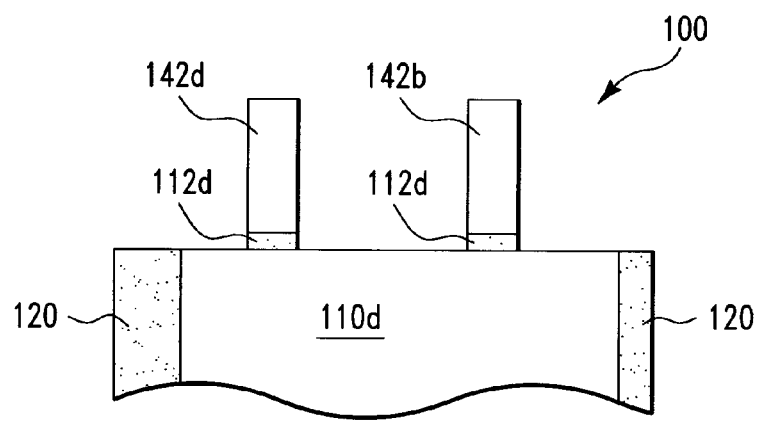
FIG. 1H"

SEMICONDUCTOR TRANSISTORS HAVING REDUCED DISTANCES BETWEEN GATE ELECTRODE REGIONS

FIELD OF THE INVENTION

The present invention relates generally to semiconductor transistors and more particularly to semiconductor transistors having reduced distances between their gate electrode regions.

BACKGROUND OF THE INVENTION

In a conventional semiconductor chip, transistors are formed on the same semiconductor substrate. In order to increase the number of transistors that can be formed on a certain area of the semiconductor substrate, the gate electrode regions of the transistors can be formed closer together. Therefore, there is a need for a method for forming the gate electrode regions of the transistors closer together than those of the prior art.

SUMMARY OF THE INVENTION

The present invention provides a semiconductor structure, comprising (a) a semiconductor substrate which includes a top substrate surface which defines a reference direction perpendicular to the top substrate surface, wherein the semiconductor substrate comprises a first semiconductor body region and a second semiconductor body region; (b) a first gate dielectric region and a second gate dielectric region on top of the first and second semiconductor body regions, respectively; (c) a first gate electrode region and a second gate electrode region, wherein the first gate electrode region is on top of the semiconductor substrate and the first gate dielectric region, and wherein the second gate electrode region is on top of the semiconductor substrate and the second gate dielectric region; (d) a gate divider region, wherein the gate divider region is in direct physical contact with the first and second gate electrode regions, and wherein the gate divider region does not overlap the first and second gate electrode regions in the reference direction.

The present invention provides a method for forming the gate electrode regions of the transistors closer together than those of the prior art.

DETAILED DESCRIPTION OF THE INVENTION

FIGS. 1A-1H'' illustrate a fabrication process of a semiconductor structure 100, in accordance with embodiments of the present invention. More specifically, with reference to FIG. 1A, the fabrication process of the semiconductor structure 100 starts with a silicon substrate 110 (top-down view).

Figure 1A:
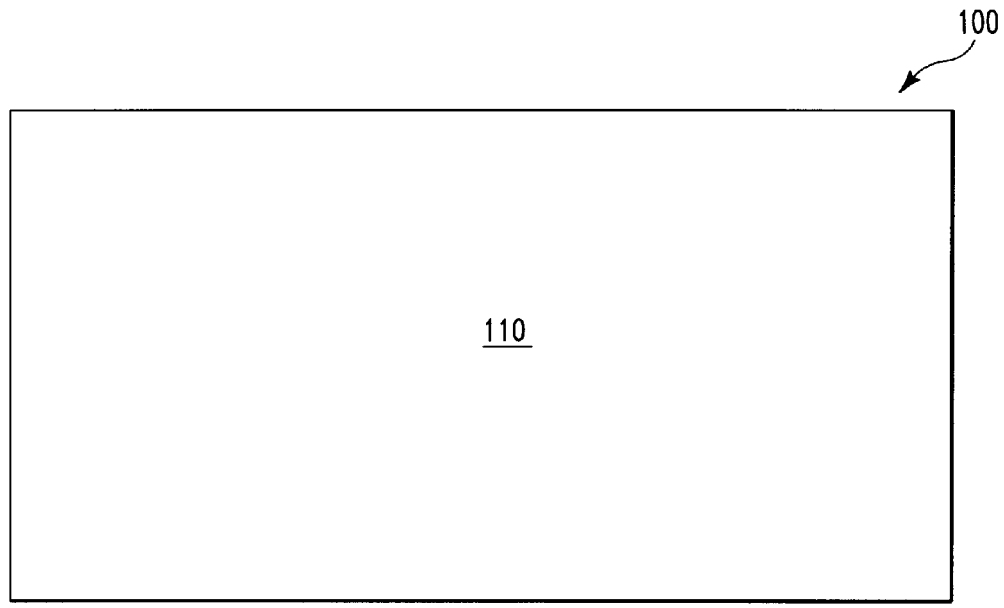
FIGS. 1A-1H'' illustrate a fabrication process of a semiconductor structure, in accordance with embodiments of the present invention.
Figure 1B:
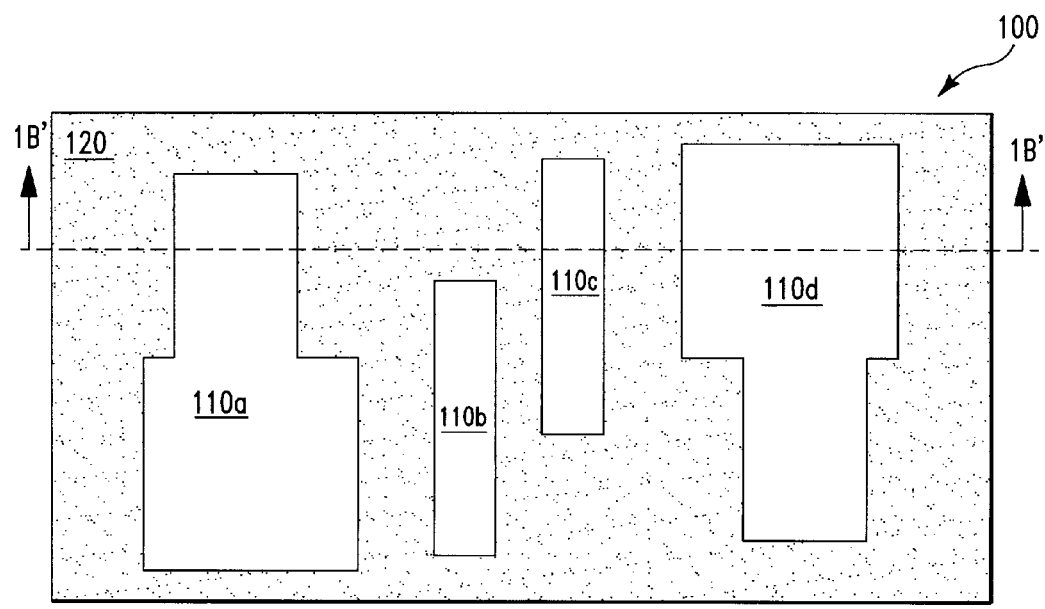
Figure 1B:
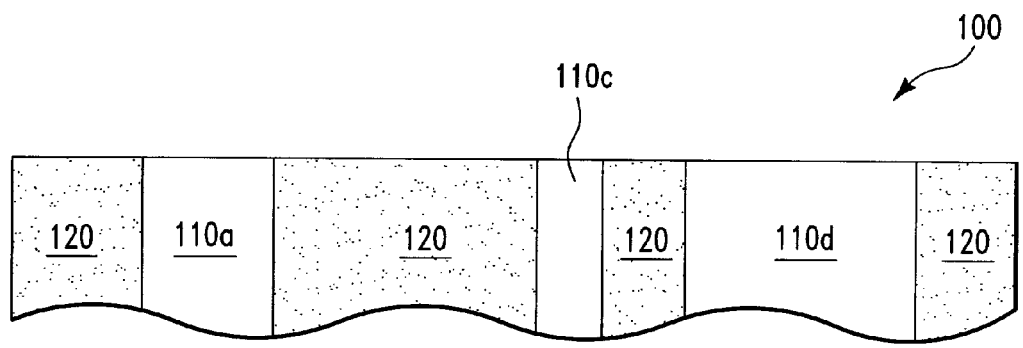

Next, with reference to FIG. 1B (top-down view), in one embodiment, an STI (shallow trench isolation) region 120 is formed in the substrate 110 resulting in active silicon regions 110a, 110b, 110c, 110d. The STI region 120 can comprise silicon dioxide. The STI region 120 can be formed by (i) forming shallow trenches in the substrate 110 using lithographic and etching processes and then (ii) filling the shallow trenches with silicon dioxide by a conventional method resulting in the STI region 120. FIG. 1B' shows a cross-section view of the semiconductor structure 100 of FIG. 1B along a line 1B'-1B'.

Figure 1C:
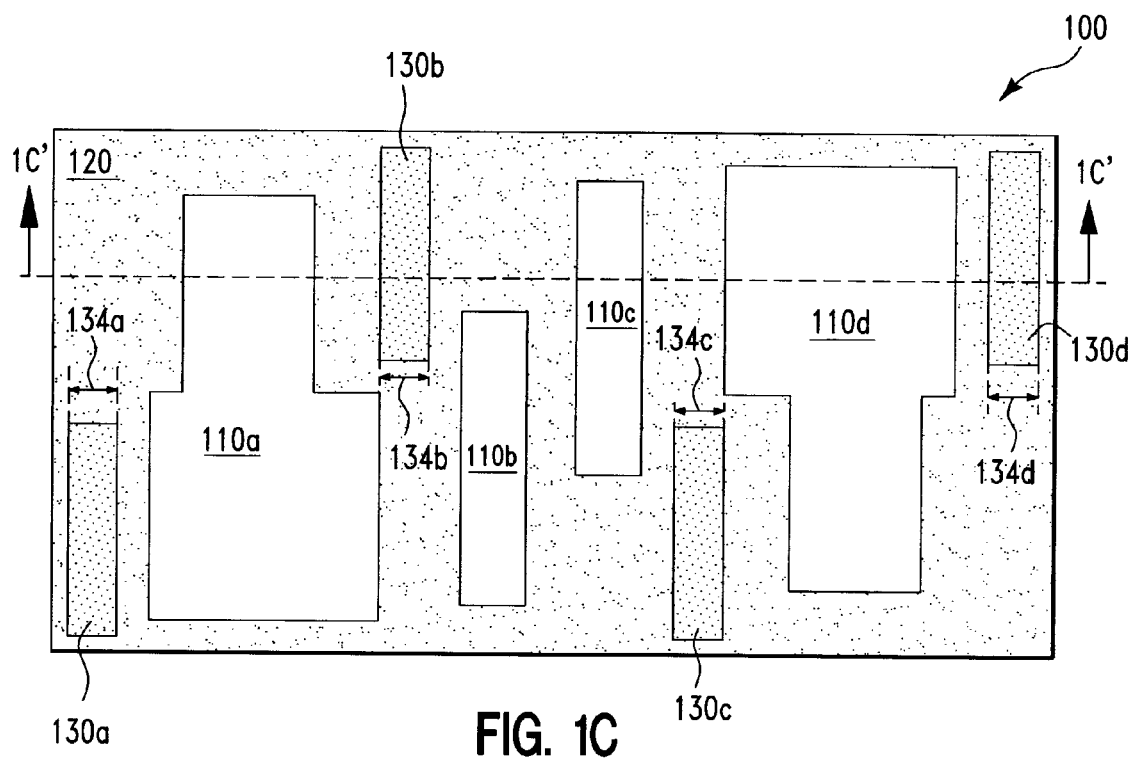
Figure 1C:
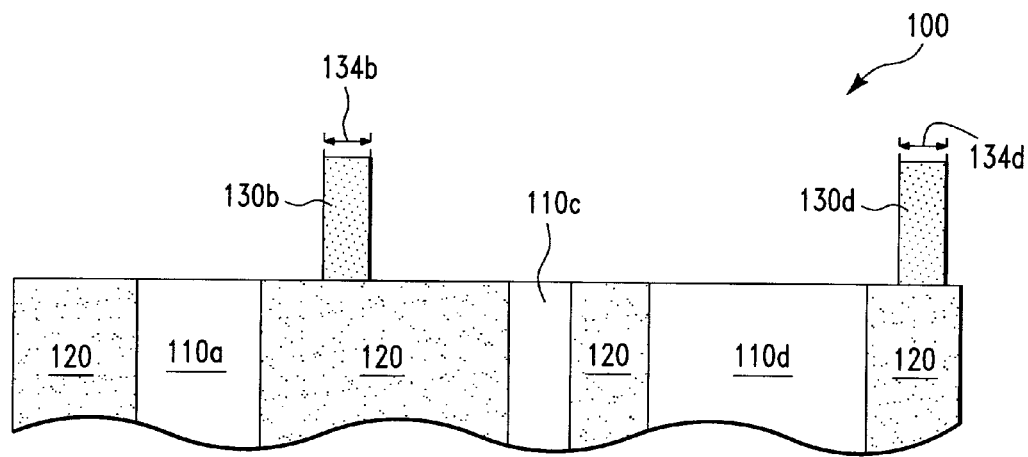

Next, with reference to FIG. 1C (top-down view), in one embodiment, gate divider regions 130a, 130b, 130c, and 130d are formed on top of the semiconductor structure 100 of FIG. 1B. The gate divider regions 130a, 130b, 130c, and 130d can comprise silicon nitride. The gate divider regions 130a, 130b, 130c, and 130d can be formed by (i) depositing a silicon nitride layer (not shown) on top of the semiconductor structure 100 of FIG. 1B and then (ii) patterning the silicon nitride layer resulting in the gate divider regions 130a, 130b, 130c, and 130d.

Next, in one embodiment, the thicknesses 134a, 134b, 134c, and 134d of the gate divider regions 130a, 130b, 130c, and 130d, respectively, are reduced by isotropically etching the gate divider regions 130a, 130b, 130c, and 130d until the thicknesses 134a, 134b, 134c, and 134d have desired values. This etching of the gate divider regions 130a, 130b, 130c, and 130d is essentially selective to the STI region 120 and the active silicon regions 110a, 110b, 110c, and 110d. In other words, the recipe of the etching of the gate divider regions 130a, 130b, 130c, and 130d (e.g., chemicals used, temperature, pressure, etc.) is such that the STI region 120 and the active silicon regions 110a, 110b, 110c, and 110d are essentially not affected by the etching of the gate divider regions 130a, 130b, 130c, and 130d. FIG. 1C' shows a cross-section view of the semiconductor structure 100 of FIG. 1C along a line 1C'-1C'.

Figure 1D:
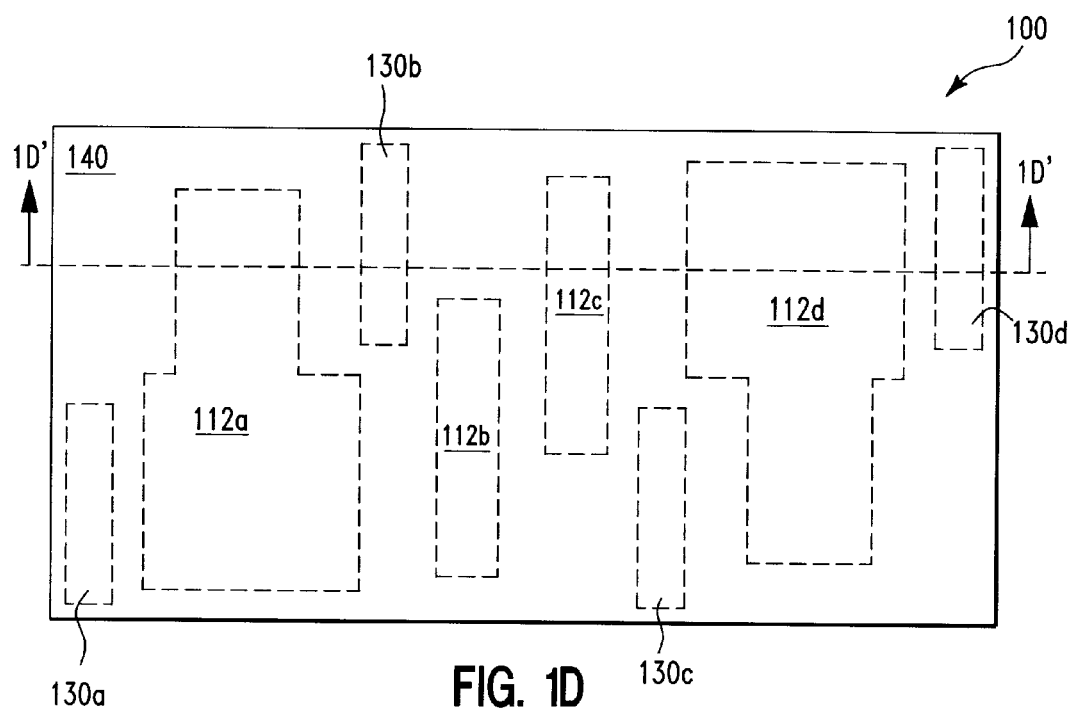
Figure 1D:
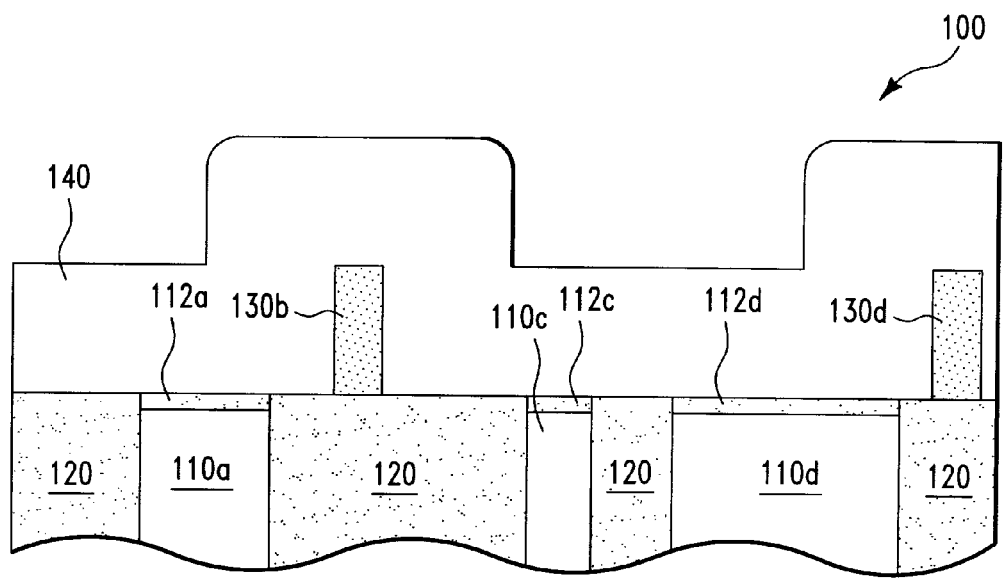

Next, with reference to FIGS. 1D and 1D' (wherein FIG. 1D' shows a cross-section view of the semiconductor structure 100 of FIG. 1D along a line 1D'-1D'), in one embodiment, gate dielectric regions 112a, 112b, 112c, and 112d are formed on the active silicon regions 111a, 110b, 110c, and 110d, respectively. The gate dielectric regions 112a, 112b, 112c, and 112d can comprise silicon dioxide. The gate dielectric regions 112a, 112b, 112c, and 112d can be formed by thermally oxidizing exposed-to-ambient silicon surfaces of the active silicon regions 110a, 110b, 110c, and 110d resulting in the gate dielectric regions 112a, 112b, 112c, and 112d, respectively.

Next, in one embodiment, a gate electrode layer 140 is formed on top of the semiconductor structure 100. The gate electrode layer 140 can be formed by CVD (Chemical Vapor Deposition) of poly-silicon on top of the semiconductor structure 100.

Figure 1E:
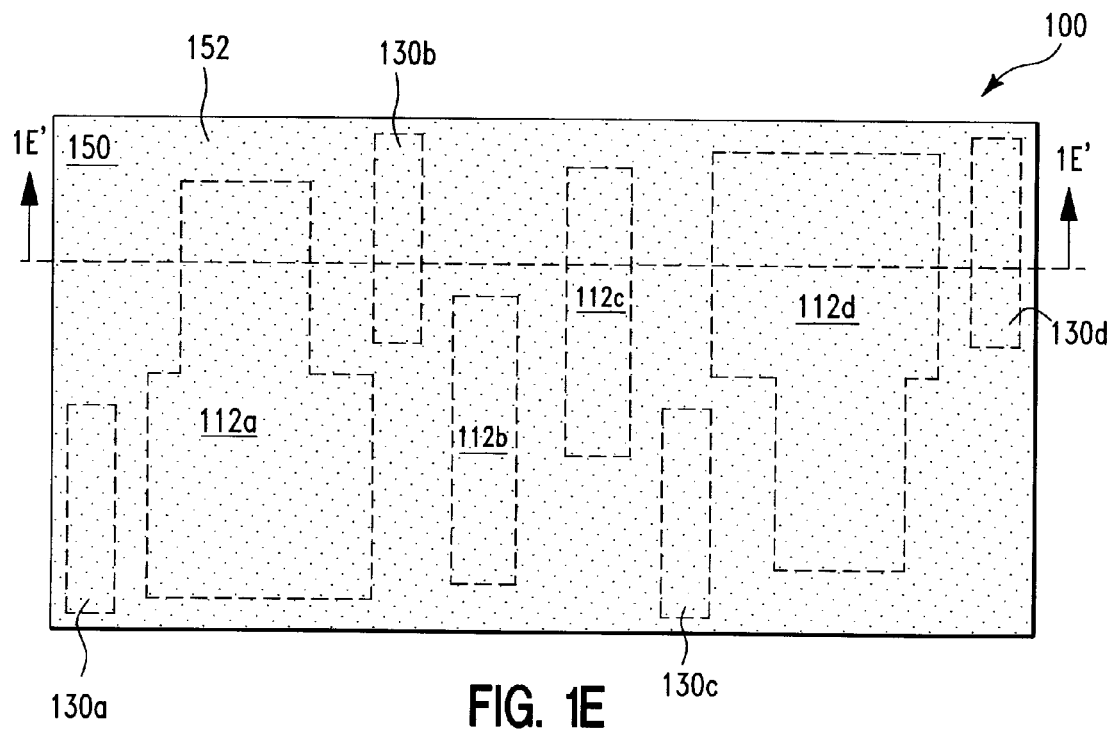
Figure 1E:
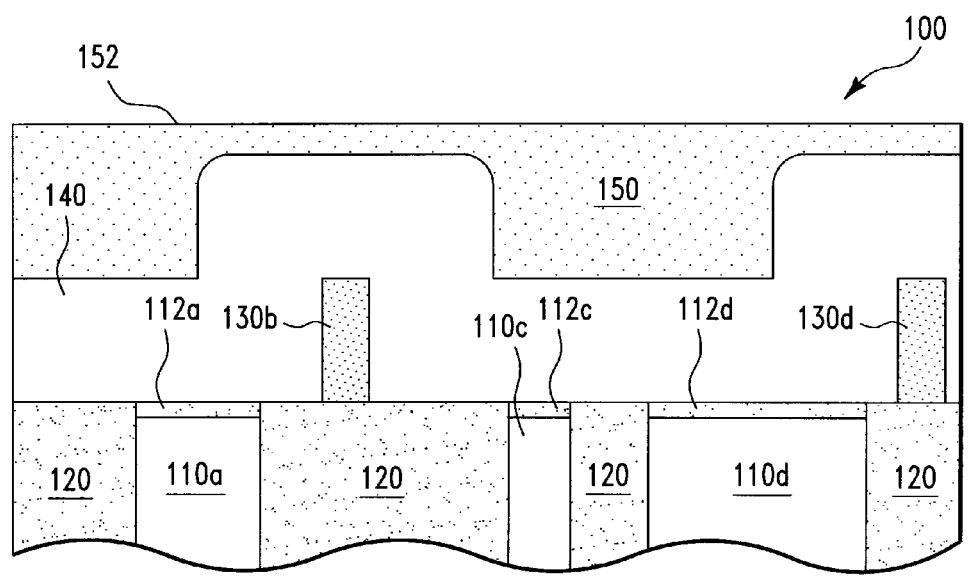

Next, with reference to FIGS. 1E and 1E' (wherein FIG. 1E' shows a cross-section view of the semiconductor structure 100 of FIG. 1E along a line 1E'-1E'), in one embodiment, a photoresist layer 150 is formed on top of the gate electrode layer 140 such that the top surface 152 of the photoresist layer 150 is planar. The photoresist layer 150 can be formed by a spin-on process.

Figure 1F:
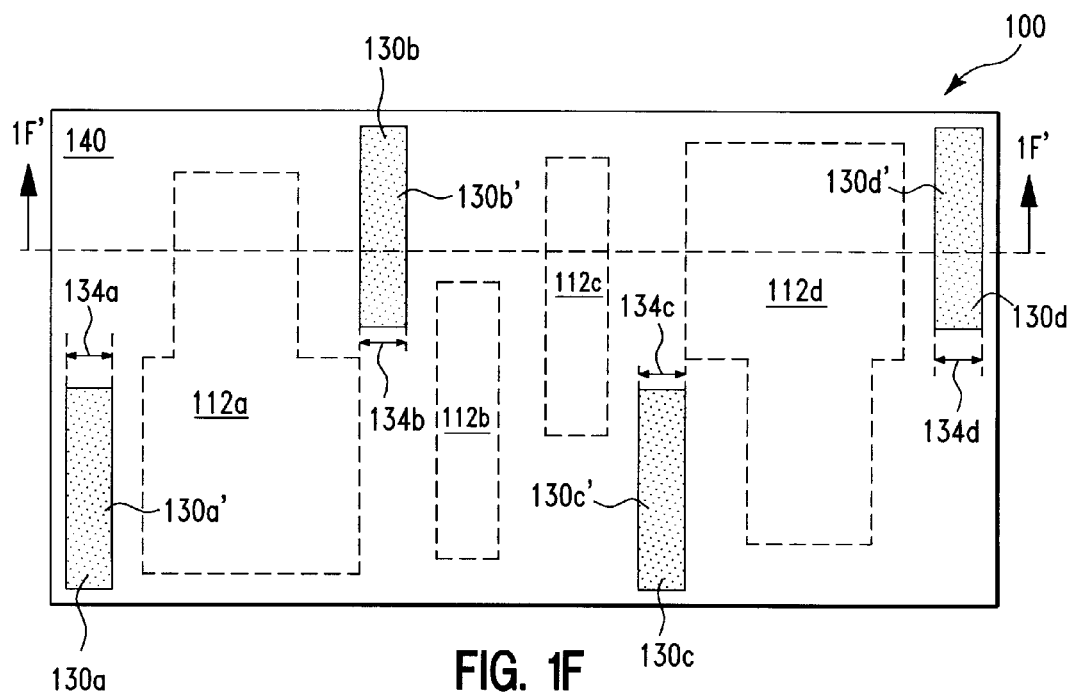
Figure 1F:
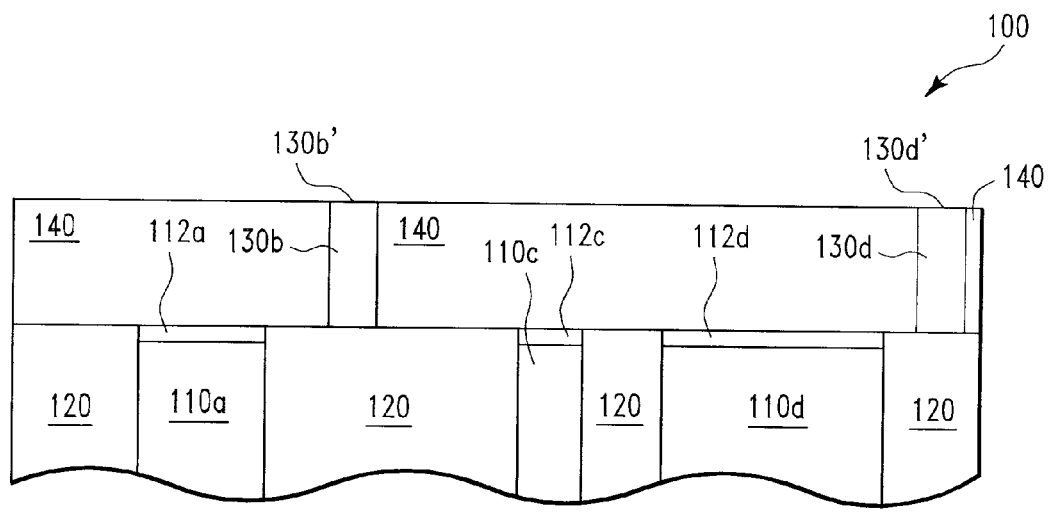

Next, in one embodiment, a CMP (Chemical Mechanical Polishing) process is performed on the top surface 152 of the photoresist layer 150 until (i) the top surfaces 130a', 130b', 130c', and 130d' (FIG. 1F) of the gate divider regions 130a, 130b, 130c, and 130d are exposed to the surrounding ambient and (ii) the entire photoresist layer 150 is completely removed, resulting in the structure 100 of FIG. 1F (top-down view). Because the top surface 152 of the photoresist layer 150 is planar, the CMP process can be performed more easily. FIG. 1F' shows a cross-section view of the semiconductor structure 100 of FIG. 1F along a line 1F'-1F'.

Figure 1G:
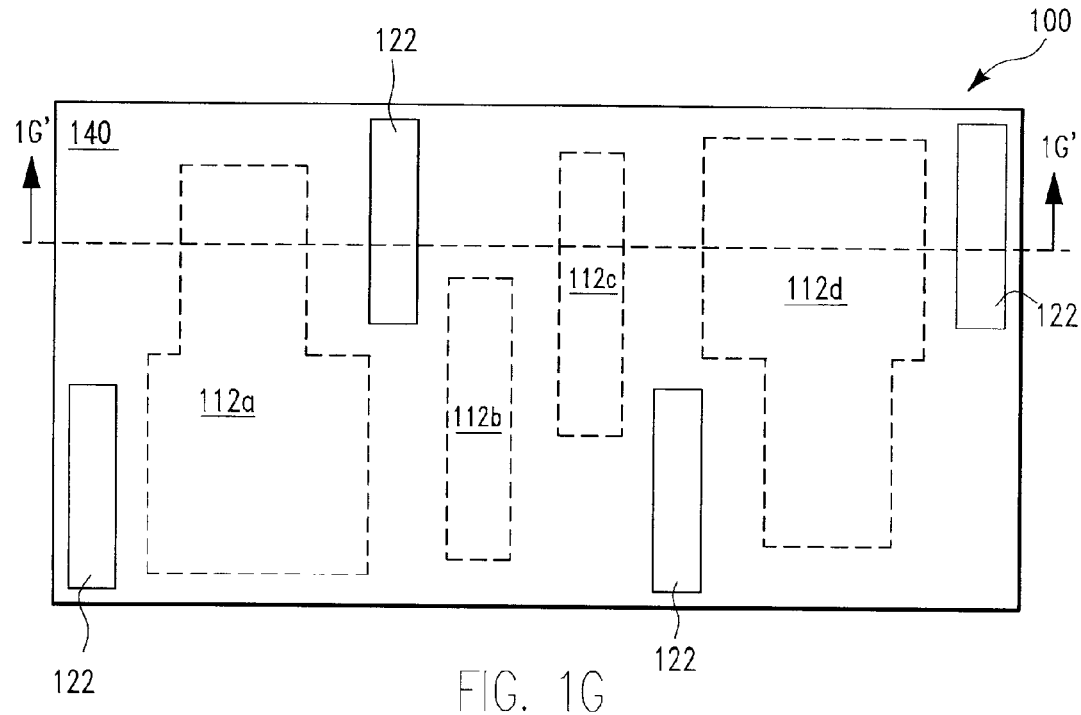
Figure 1G:
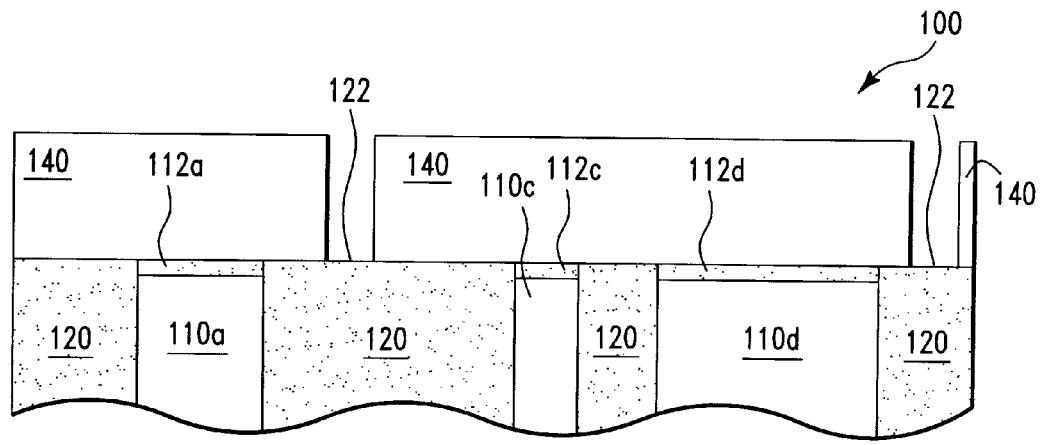

Next, in one embodiment, the gate divider regions 130a, 130b, 130c, 130d are completely removed such that the top surface 122 (FIG. 1G) of the STI region 120 is exposed to the surrounding ambient through the spaces of the removed gate divider regions 130a, 130b, 130c, and 130b resulting in the structure 100 of FIG. 1G (top-down view). The gate divider regions 130a, 130b, 130c, and 130d can be removed by wet etching. FIG. 1G' shows a cross-section view of the semiconductor structure 100 of FIG. 1G along a line 1G'-1G'.

Figure 1H:
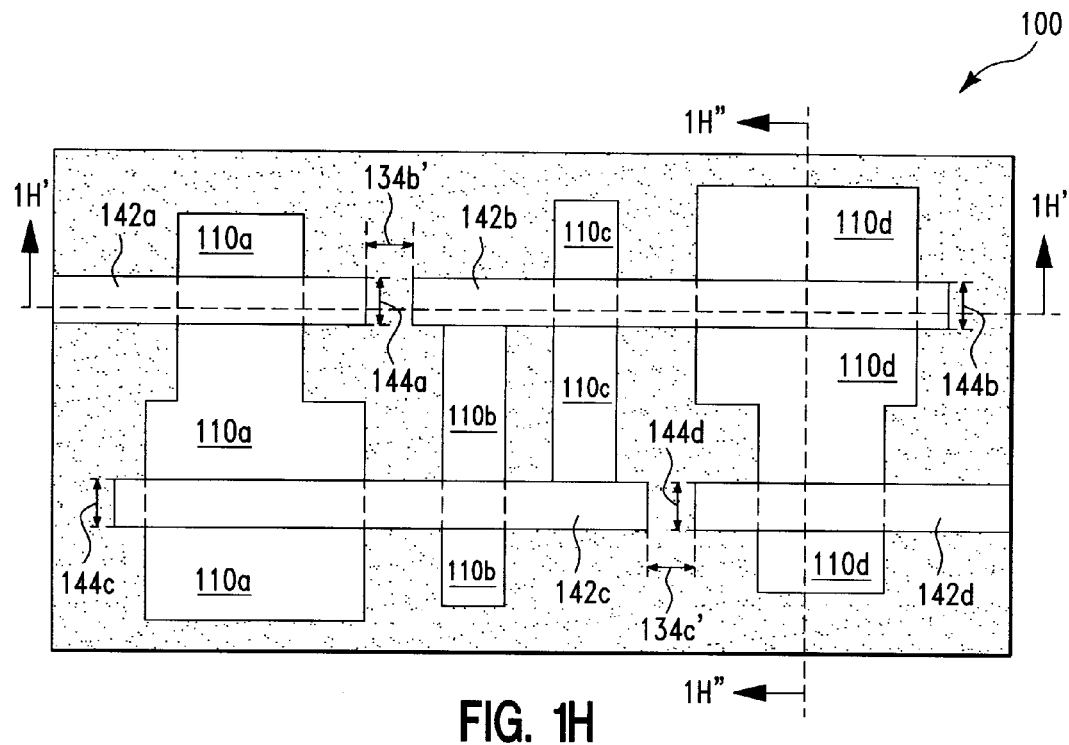

Next, in one embodiment, the gate electrode layer 140 is patterned resulting in gate electrode regions 142a, 142b, 142c, and 142d of FIG. 1H (top-down view). The gate electrode layer 140 can be patterned by lithographic and etching processes. With reference to FIG. 1H, it should be noted that, at this time, because of the formation of the gate electrode regions 142a, 142b, 142c, and 142d by the lithographic process, the distance 134b' between the gate electrode regions 142a and 142b is greater than the thickness 134b of the gate divider region 130b (FIG. 1F). Similarly, because of the formation of the gate electrode regions 142a, 142b, 142c, and 142d by the lithographic process, the distance 134c' between the gate electrode regions 142c and 142d is greater than the thickness 134c of the gate divider region 130c (FIG. 1F). It should be noted that, at this time, the gate dielectric regions 112a, 112b, 112c, and 112d (shown in FIG. 1G) remain on top of the active silicon regions 110a, 110b, 110c, and 110d, respectively, but will be later removed (therefore not shown in FIG. 1H) as described below.

Next, in one embodiment, the thicknesses 144a, 144b, 144c, and 144d of the gate electrode regions 142a, 142b, 142c, and 142d, respectively, are reduced by isotropically etching the gate electrode regions 142a, 142b, 142c, and 142d until the thicknesses 144a, 144b, 144c, and 144d have desired values. Also as a result of the etching of the gate electrode regions 142a, 142b, 142c, and 142d, the distance 134b' between the gate electrode regions 142a and 142b and the distance 134c' between the gate electrode regions 142c and 142d are increased. Therefore, as a result of the formation of the gate electrode regions 142a, 142b, 142c, and 142d by the lithographic process and as a result of the subsequent etching of the resulting gate electrode regions 142a, 142b, 142c, and 142d, the distances 134b' and 134c' are greater than the thicknesses 134b and 134c of the gate divider regions 130b and 130c, respectively (FIG. 1F). The etching of the gate electrode regions 142a, 142b, 142c, and 142d can be wet etching.

Next, in one embodiment, portions of the gate dielectric regions 112a, 112b, 112c, and 112d not covered by the gate electrode regions 142a, 142b, 142c, and 142d are removed by a conventional anisotropic etching step with the gate electrode regions 142a, 142b, 142c, and 142d as blocking masks resulting in the structure 100 of FIG. 1H. As a result, the top surfaces of the active silicon regions 110a, 110b, 110c, and 110d are exposed to the surrounding ambient. Also as a result, portions of the gate dielectric regions 112a, 112b, 112c, and 112d which are directly beneath the gate electrode regions 142a, 142b, 142c, and 142d remain on top of the active silicon regions 110a, 110b, 110c, and 110d. FIG. 1H' shows a cross-section view of the semiconductor structure 100 of FIG. 1H along a line 1H'-1H'. FIG. 1H" shows a cross-section view of the semiconductor structure 100 of FIG. 1H along a line 1H"-1H".

Next, with reference to FIG. 1H, in one embodiment, transistors are formed on the active silicon regions 110a, 110b, 110c, and 110d. More specifically, each of the gate electrode regions 142a, 142b, 142c, and 142d crossing over an active silicon region can form a transistor in which the gate electrode region serves as the gate electrode region of the transistor. For example, the gate electrode region 142b crossing over the active silicon region 110d can form a transistor in which the gate electrode region 142b serves as the gate electrode region of the transistor. Source/Drain regions of the transistor are subsequently formed in the active silicon region 110d. In total, six transistors can be formed on the semiconductor structure 100 of FIG. 1H.

In summary, with reference to FIGS. 1F and 1H, the distance 134b' between the gate electrode regions 142a and 142b depends on the thickness 134b of the gate divider region 130b, whereas the distance 134c' between the gate electrode regions 142c and 142b depends on the thickness 134c of the gate divider region 130c. As a result, the reductions of the thicknesses 134b and 134c of the gate divider region 130b and 130c result in the reductions of the distances 134b' and 134c', respectively. The reductions of the thicknesses 134b and 134c of the gate divider regions 130b and 130c can be easily performed by an anisotropic etching step as described above.

Figure 2A:
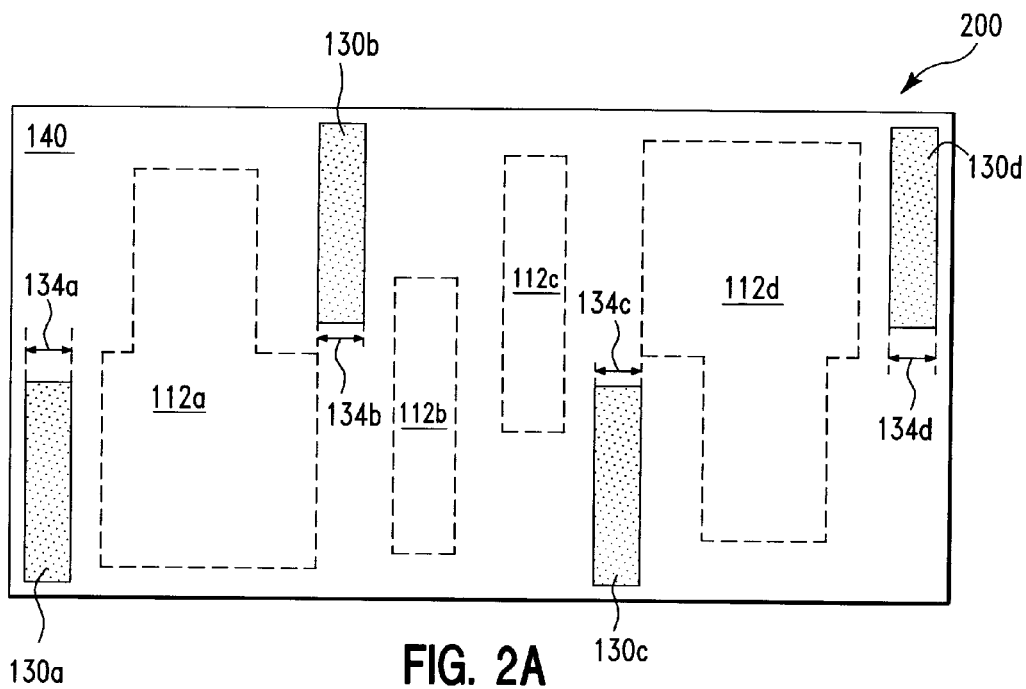
FIGS. 2A-2B' illustrate a fabrication process of another semiconductor structure, in accordance with embodiments of the present invention.
Figure 2B:
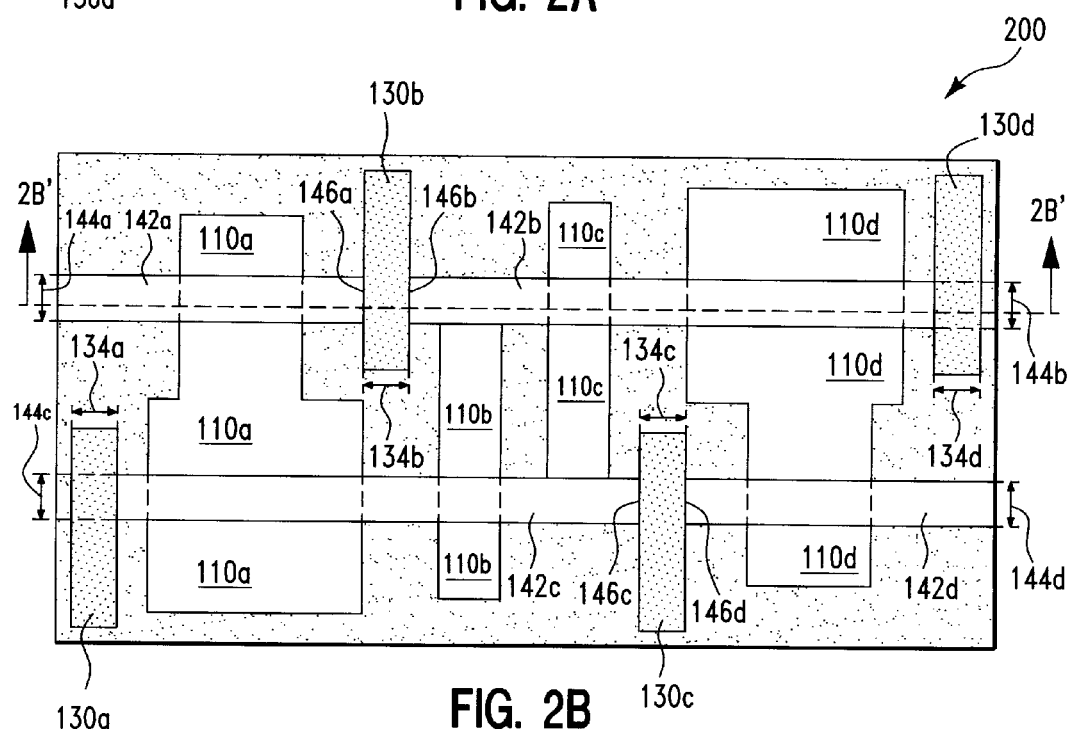
Figure 2B:
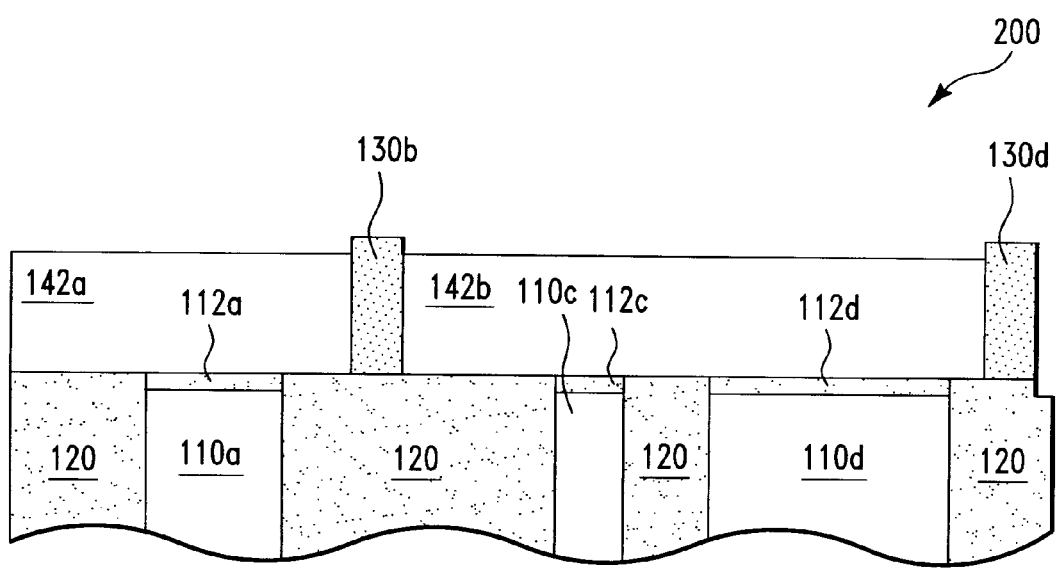

FIGS. 2A-2B' illustrate a fabrication process of a semiconductor structure 200, in accordance with embodiments of the present invention. More specifically, with reference to FIG. 2A (top-down view), the fabrication process of the semiconductor structure 200 starts with the structure 200 of FIG. 2A. The structure 200 of FIG. 2A is similar to the structure 100 of FIG. 1F. The formation of the structure 200 of FIG. 2A is similar to the formation of the structure 100 of FIG. 1F.

Next, in one embodiment, with the gate divider regions 130a, 130b, 130c, and 130d in place (not removed as in the embodiments described above with respect to FIGS. 1A-1H"), the gate electrode layer 140 is patterned resulting in the gate electrode regions 142a, 142b, 142c, and 142d of FIG. 2B (top-down view). The gate electrode layer 140 can be patterned by lithographic and etching processes.

Next, in one embodiment, the thicknesses 144a, 144b, 144c, and 144d of the gate electrode regions 142a, 142b, 142c, and 142d, respectively, are reduced by isotropically etching the gate electrode regions 142a, 142b, 142c, and 142d until the thicknesses 144a, 144b, 144c, and 144d have desired values.

Because the side walls 146a and 146b of the gate electrode regions 142a and 142b, respectively, are in direct physical contact with the gate divider region 130b, the side walls 146a and 146b are not affected (i) by the patterning of the gate electrode layer 140 to create the gate electrode regions 142a, 142b, 142c, and 142d and (ii) by the subsequent etching of the resulting gate electrode regions 142a, 142b, 142c, and 142d to reduce their thicknesses. As a result, the distance 134b between the gate electrode regions 142a and 142b is equal to the thickness 134b of the gate divider region 130b. Similarly, because the side walls 146c and 146d of the gate electrode regions 142c and 142d, respectively, are in direct physical contact with the gate divider region 130c, the side walls 146c and 146d are not affected (i) by the patterning of the gate electrode layer 140 to create the gate electrode regions 142a, 142b, 142c, and 142d and (ii) by the subsequent etching of the gate electrode regions 142a, 142b, 142c, and 142d to reduce their thicknesses. As a result, the distance 134c between the gate electrode regions 142c and 142d is equal to the thickness 134c of the gate divider region 130c.

Next, in one embodiment, portions of the gate dielectric regions 112a, 112b, 112c, and 112d not covered by the gate electrode regions 142a, 142b, 142c, and 142d are removed by a conventional anisotropic etching step with the gate electrode regions 142a, 142b, 142c, and 142d as blocking masks resulting in the structure 100 of FIG. 2B. As a result, the top surfaces of the active silicon regions 110a, 110b, 110c, and 110d are exposed to the surrounding ambient. Also as a result, portions of the gate dielectric regions 112a, 112b, 112c, and 112d which are directly beneath the gate electrode regions 142a, 142b, 142c, and 142d remain on top of the active silicon regions 110a, 110b, 110c, and 110d. FIG. 2B' shows a cross-section view of the semiconductor structure 200 of FIG. 2B along a line 2B'-2B'.

In summary, with reference to FIG. 2B, the distance 134b between the gate electrode regions 142a and 142b is equal to the thickness 134b of the gate divider region 130b, whereas the distance 134c between the gate electrode regions 142c and 142b is equal to the thickness 134c of the gate divider region 130c. As a result, the reductions of the thicknesses 134b and 134c of the gate divider region 130b and 130c result in the reductions of the distances 134b and 134c, respectively. The reductions of the thicknesses 134b and 134c of the gate divider regions 130b and 130c can be easily performed by an anisotropic etching step as described above.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure fabrication method, comprising:
    providing a semiconductor structure which includes a semiconductor substrate,
        wherein the semiconductor substrate includes a top substrate surface which defines a reference direction perpendicular to the top substrate surface, and wherein the semiconductor substrate further includes a first semiconductor body region and a second semiconductor body region;
    depositing a silicone nitride layer consisting of silicon nitride on and in direct physical contact with the semiconductor substrate;
    patterning the silicon nitride layer resulting in formation of a first gate divider region and a second gate divider region on top of the semiconductor substrate, wherein the first gate divider region and the second gate divider region each consists of silicon nitride and is in direct physical contact with a shallow trench isolation (STI) region in the semiconductor substrate, and wherein said patterning the silicon nitride layer has removed silicon nitride of the silicon nitride layer such that a surrounding ambient separates the first gate divider region and the second gate divider region from each other;
    after said patterning the silicon nitride layer, forming a gate electrode layer on top of the semiconductor substrate, wherein the first gate divider region and the second gate divider region are each in direct physical contact with the gate electrode layer; and
    after said forming the gate electrode layer, patterning the gate electrode layer resulting in a first gate electrode region and a second gate electrode region being formed.

2. The method of claim 1,
    wherein a top surface of the gate electrode layer and a top surface of the first gate divider region are essentially coplanar, and
    wherein the first gate divider region does not overlap the first and second gate electrode regions in the reference direction.

3. The method of claim 1, further comprising, after said providing the semiconductor substrate is performed and before said patterning the silicon nitride layer is performed, forming the (STI) region,
    wherein the STI region is in direct physical contact with the first and second semiconductor body regions and the first gate divider region,
    wherein the first and second semiconductor body regions do not overlap the STI region in the reference direction, and
    wherein the entire first gate divider region overlaps the STI region in the reference direction.

4. The method of claim 1, further comprising, after said providing the semiconductor substrate is performed and before said forming the gate electrode layer is performed, forming a first gate dielectric region and a second gate dielectric region on top of the first and second semiconductor body regions, respectively.

5. The method of claim 4, wherein the gate dielectric regions comprise an oxide material.

6. The method of claim 3, further comprising, after said forming the gate electrode layer is performed and before said patterning the gate electrode layer is performed, completely removing the first gate divider region, resulting in formation of an opening in the gate electrode layer through which a portion of a top surface of the STI region is exposed to the surrounding ambient, and further resulting in a thickness of the opening in a first direction that is perpendicular to the reference direction being equal to a thickness of the first gate divider region in the first direction, wherein said opening separates the first gate electrode region and the second gate electrode region from each other.

7. The method of claim 6, wherein said completely removing the first gate divider region comprises wet etching the first gate divider region.

8. The method of claim 1, wherein said forming the gate electrode layer comprises:
    depositing a gate layer on top of the semiconductor substrate and the first gate divider region;
    depositing a photoresist layer on top of the gate layer such that a top surface of the photoresist layer is planar;
    completely removing the photoresist layer; and
    partially removing the gate layer such that what remains of the gate layer after said partially removing is performed is the gate electrode layer.

9. The method of claim 8,
    wherein said depositing the gate layer comprises depositing an electrically conductive material by CVD (Chemical Vapor Deposition) on top of the semiconductor substrate and the first gate divider region, and
    wherein said depositing the photoresist layer comprises spin-applying a photoresist material on top of the gate layer.

10. The method of claim 8, wherein said completely removing the photoresist layer and said partially removing the gate layer comprise polishing the top surface of the photoresist layer by CMP (Chemical Mechanical Polishing) resulting in the photoresist layer being completely removed.

11. The method of claim 1, wherein said patterning the gate electrode layer comprises lithographic and etching processes followed by an isotropic etching step.

12. The method of claim 6, wherein said patterning the gate electrode layer increases the thickness of the opening in the first direction.

* * * * *